United States Patent [19]

Cahen

[11] 3,890,610

[45] June 17, 1975

[54] HIGH-PRECISION DIGITAL-TO-ANALOG CONVERTERS

[75] Inventor: Olivier Cahen, Paris, France

[73] Assignee: Thomson-CSF, Paris, France

[22] Filed: Oct. 29, 1973

[21] Appl. No.: 410,410

[30] Foreign Application Priority Data

Oct. 31, 1972 France .............................. 72.38594

[52] U.S. Cl........ 340/347 CC; 340/347 DA; 29/577

[51] Int. Cl........................................... H03k 13/02

[58] Field of Search........ 340/347 DA; 29/593, 577, 29/574

[56] References Cited

UNITED STATES PATENTS

| | | | |
|---|---|---|---|
| 2,963,698 | 12/1960 | Slocomb | 340/347 DA |
| 3,553,830 | 1/1971 | Jenny et al. | 29/577 |
| 3,750,141 | 7/1973 | Poretti et al. | 340/347 DA |

OTHER PUBLICATIONS

Kelson et al., "Monolithic 10-b Digital-To-Analog Converter Using Ion - - -," IEEE Journal of Solid-State Circuits, Vol. SC-8, No. 6, 12/1973, p. 396–403.

*Primary Examiner*—Thomas J. Sloyan
*Attorney, Agent, or Firm*—Karl F. Ross; Herbert Dubno

[57] ABSTRACT

A high-precision digital-to-analog converter, manufactured by the technique of monolithic integrated circuits, uses integrated resistors formed by ion implantation. The resistors are arranged in a series of ladder networks, the steps of each ladder corresponding to predetermined binary digits of a logical information. Fuses interconnect different steps of different ladders; they can be melted by passing an overload current through them. Their elimination in suitable locations facilitates an adjustment of the converter.

10 Claims, 4 Drawing Figures

HIGH-PRECISION DIGITAL-TO-ANALOG CONVERTERS

The present invention relates to digital-to-analog converters, more particularly to devices for converting a binary number of n digits or bits into an electrical analog signal (voltage or current) proportional to the number. Conventional devices of this kind have n inputs for respective bits and a single output. The relative accuracy of such an n-bit converter is obviously $1/2^n$ since there are n significant digits.

The converters are generally designed to receive voltages coming from d.c. sources of given internal impedance; switches are provided for connecting or disconnecting these sources for producing at will voltages of various magnitudes corresponding to the values 1 and 0 of each binary digit. They essentially comprise passive circuits constituted by networks or chains of ohmic resistors. They can also comprise active components, such as impedance adapting circuits. Three partly contradictory objectives are generally sought to be attained:

high accuracy of the output analog quantity, which is generally determined by the accuracy and stability of the resistors in the passive circuit;

low price, which presumes easy and rapid adjustment of the resistors in cases where it is not possible to produce them directly within fixed tolerances;

speed of operation, which presumes that parasitic capacitances will be small, giving short time constants.

Sixteen-bit converters, operating with a margin of accuracy on the order of $1/2^{16}$ or substantially $10^{-5}$, are known which are built from lumped components; the resistors are of the kind which can be trimmed by superficial abrasion, for example with the aid of a sand jet or by using a laser beam to burn off material.

Their manufacture is a lengthy and expensive business. Their speed of operation is limited.

There are also twelve-bit converters, which are therefore less accurate (margin of $10^{-3}$ to $10^{-4}$), built in the form of so-called hybrid circuits, comprising resistor chains deposited either by silk-screen printing (referred to as a thick-film technique) or by thin-film technology, on the one hand, and comprising on the other hand lumped components such as transistors. The speed of operation of such hybrid circuits is better than in the case of lumped components, but the manufacturing cost is still relatively high by reason of the need for individually adjusting resistances by methods similar to those described above.

Converters can be mass-produced at low cost, in the form of monolithic integrated circuits which will have very short time constants by virtue of their very tiny dimensions. Unfortunately, "integrated" resistors are not accurate in terms of resistance if produced by the current methods of diffusion through openings in a mask formed by photolithography. In addition, resistors of this kind do not have temperature stability if their "resistance per square" is high; this factor, expressed in ohms, is the quotient of the resistivity of the constituent resistor material divided by the thickness of the film. Employing current methods of manufacture, a resistance per square of 500 ohms cannot be exceeded, whereas the production of high-accuracy converters requires values which are twenty to one-hundred times higher than that. These resistors must therefore be long and narrow and the relative inaccuracy of their width has a direct bearing upon the final value of the resistances.

The object of my invention is to overcome these difficulties and to produce accurate, inexpensive and fast-operating converters properly calibrated with the aid of associated trimming circuitry.

This object is realized, in accordance with my present invention, by the provision of at least two resistive networks, i.e. a first and a second ladder network, or respectively n and j sections with $j < n$; each section includes a series resistor of magnitude R and a branch resistor of magnitude 2R forming a junction, there being thus n such junctions in the first and j such junctions in the second ladder network. The two ladder networks are connected in parallel between the analog output terminal and the ground terminal of the converter, with interposition of a resistive connection of magnitude greater than R (specifically 3R in the embodiment described hereinafter) interposed between the second network and the output terminal. The n junctions of the first ladder network are connected via n first impedance-adapting means, of substantially zero output impedance, to respective digital input terminals of the converter whose ranks increase with decreasing separation of the associated junctions from the analog output terminal. The j junctions of the second ladder network are similarly connected, via $j$ second impedance-adapting means of substantially zero output impedance, to the $j$ highest-ranking input terminals, advantageously in cascade with the corresponding first impedance-adapting means, with interposition of rupturable connectors between one or more of the second impedance-adapting means and the respective input terminals so that the output voltage of the first ladder network due to energization of these input terminals is modified. With the rupturable connectors designed as fusible conductors, the resistive networks and the associated impedance adapters may be incorporated together with these conductors in a monolithic integrated circuit.

The invention will be better understood, and other of its features will become apparent, from a consideration of the ensuing description and the annexes drawing in which.

Figure 1:
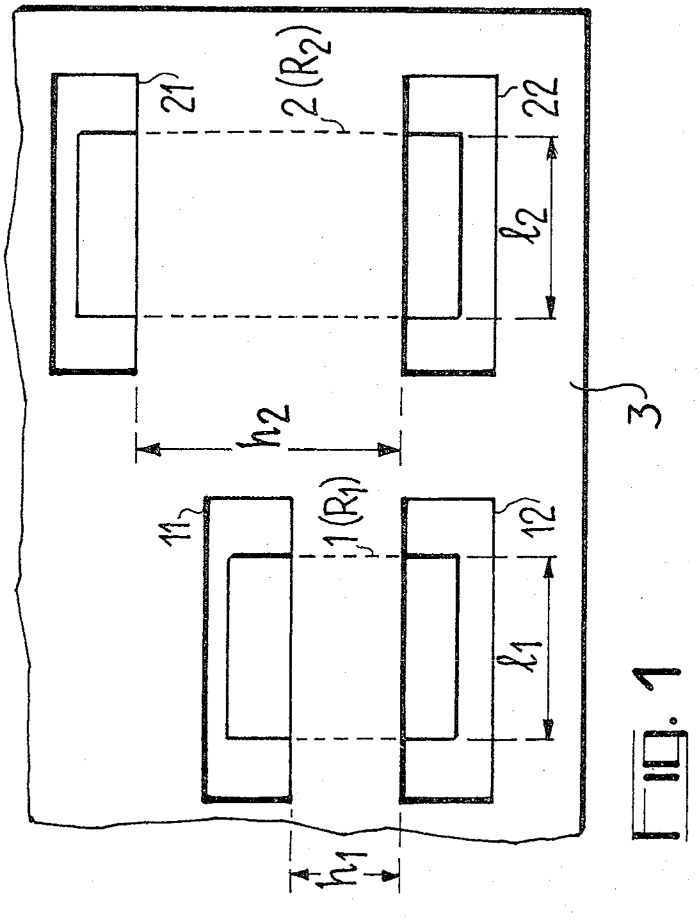
FIG. 1 illustrates the principle of manufacture of the integrated resistors in a converter embodying my invention.

FIG. 1 shows two thin-film resistive zones 1 and 2 located in the plane of the drawing. They are largely concealed by a mask portion 3 in which there have been cut windows 11, 12, 21 and 22. These windows are designed to delimit ohmic-contact zones of the completed resistors:

11 and 12 for resistor $R_1$ (zone 1);

21 and 22 for resistor $R_2$ (zone 2).

The ohmic contacts are formed, for example, by evaporation of a metal through the windows of the mask 3 which is applied against the surface of the zones 1 and 2.

Thus, there are two successive masking operations, the first in order to form, preferably by ion implantation, the areas 1 and 2 in a semiconductor chip, and the second in order to form the ohmic-contact areas.

The other characteristics of the integrated resistors of my improved converter, are as follows:

as far as accuracy is concerned, this depends only upon the widths ($l_1$ for the area 1, $l_2$ for the area 2) at the time of the first masking operation and upon the intervals formed, at the time of the second masking operation, between the windows 11 and 12 for $R_1$, and 21 and 22 for $R_2$; any inaccuracy in the position of the second mask has no influence upon the final accuracy;

as far as the absolute error in the dimensions of the areas and windows is concerned, an accuracy on the order of a tenth of a micron can be reached by using an electron beam scanning an electron-sensitive film, in order to trace the masks: this is a well-known current electronic masking technique;

as far as the relative error in $R_1$ and $R_2$ is concerned, this error is minimal when the ratios $l_1/h_1$ and $l_2/h_2$ are equal to 1; in the present instance, they are maintained between ½ and 2;

as far as resistors of high resistance value are concerned, such as are required in converters in order to achieve both high accuracy and low power consumption, known methods of doping-impurity diffusion do not permit realization of a "resistance per square" in excess of 500 ohms and compatible with good temperature stability, whereas in the instant case, thanks to the technique of ion implantation, resistances per square on the order of 10,000 ohms with a temperature coefficient of 0.3% per degree centigrade are achieved.

Figure 2:
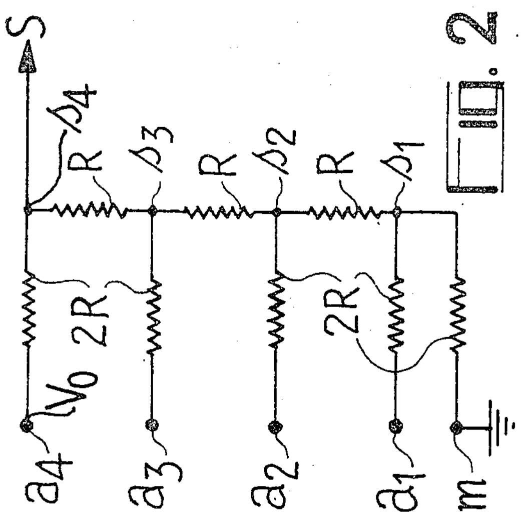
FIGS. 2 and 3 are diagrams of conventional elements, given by way of example, embodied in my improved converter.

FIG. 2 illustrates a conventional resistor ladder network, designated hereafter simply as a "ladder," for a digital-to-analog converter. This ladder is of the "R – 2R" type. In the case of a four-bit converter, having four actions as shown in FIG. 2, the network comprises four inputs $a_1$ to $a_4$ connected via respective branch resistors to junctions $s_1 - s_4$ formed within each section by its branch resistor and an associated series resistor; the section $s_4$ remotest from ground, connected to the highest-ranking input $a_4$, is directly tied to the analog output terminal $s$. The branch resistors constituting the steps of the "ladder" parallel to $a_4s_4$ ($a_3s_3$, $a_2s_2$, $a_1s_1$) as well as the final series resistor, linking the last junction $s_1$ with a ground terminal $m$, have a resistance of magnitude 2R; the other series resistors, interconnecting the successive junctions $s_1$ - $s_4$, have a value R. The ladder illustrated by way of example in FIG. 2 is a so-called four-step ladder. To the inputs $a_1$, $a_2$ etc, there are applied voltages $A_1V_o$, $A_2V_o$, etc.; $A_1$, $A_2$ etc. represent operators alternatively carrying the values 1 and 0, whereas $V_o$ represents a d-c voltage. Calculation shows that between the output $s_4$ and ground, a voltage:

$$V_S = A_4V_o/2 + A_3V_o/4 + A_2V_o/8 + A_1V_o/16 \quad (1)$$

is obtained.

Thus, the output voltage is proportional to a binary number whose digits, from right to left, are: $A_4$, $A_3$, $A_2$ and $A_1$. As a matter of fact, the equation (1) could be written:

$$V_S = V_o/16\ (A_1 + A_2\ 2^1 + A_3\ 2^2 + A_4\ 2^3) \quad (2)$$

It is clear that $V_S$ is proportional to the number to be converted, expressed in the binary code.

Figure 3:
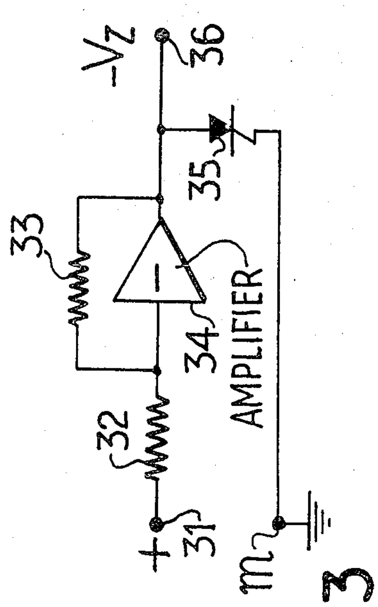

FIG. 3 shows an impedance adapter. The gain of an inverting amplifier 34 having a low-impedance output is stabilized by a negative-feedback resistor 33. The output voltage of the amplifier is maintained constant by a Zener diode 35. Input signals, i.e. voltages supplied by a source of whatever may be impedance may be, are applied between the ground m and a terminal 31, connected through a resistor 32 to the input of the amplifier 34. The output voltage is taken between a terminal 36, connected to the output of the amplifier 34, and the grounded cathode of the diode 35. This output voltage, if the amplifier is adjusted in a suitable manner, can take only two levels: zero and $V_Z$ (breakdown voltage of the Zener diode). Thus, a low-internal-resistance source has been obtained which delivers a voltage $A_1\ V_o$ or $A_2\ V_o$ etc. to supply any ladder-network input of the converter.

Figure 4:
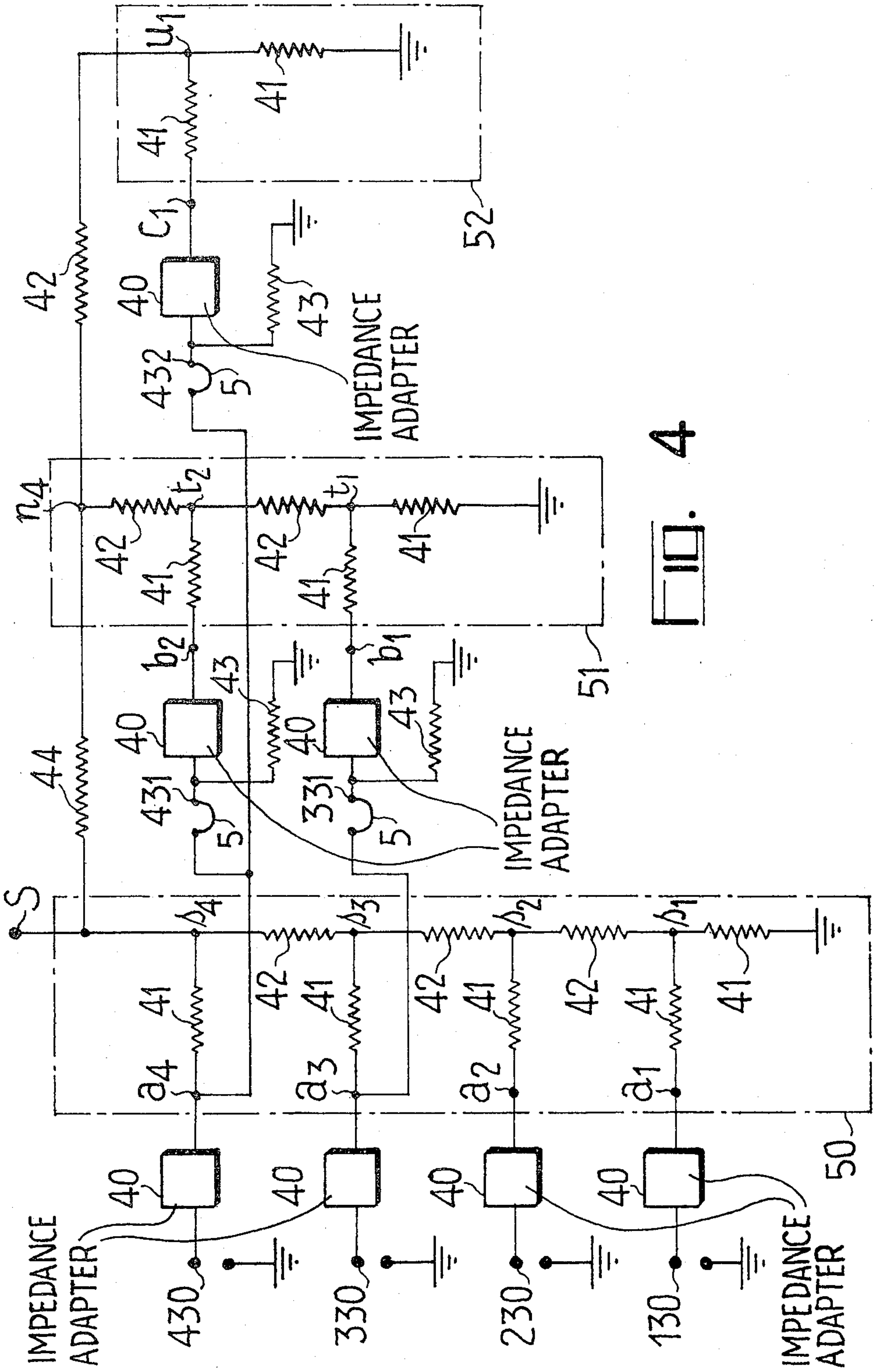
FIG. 4 is an equivalent circuit diagram of a converter in accordance with the invention.

FIG. 4 shows an example of a four-digit converter in accordance with the invention. The digits $A_1$ and $A_2$ of this converter are considered as "intrinsically" exact digits, because they produce at the output an error of less than $1/2^4$ by their combined effects, if the voltages supplied to the inputs $a_1$ and $a_2$ are other than 0.

This converter comprises a main ladder 50 with four steps and two auxiliary ladders 51 (two steps) and 52 (one step). These latter ladders are connected respectively to the inputs $a_3$ and $a_4$ by means of fuses 5.

The digital inputs are applied between ground and respective terminals 130, 230, etc. which give access to impedance adapters 40, for example of the kind shown in FIG. 3, whose outputs $a_1$, $a_2$ etc. are the digital inputs of the ladder 50, the latter being for example of the kind shown in FIG. 2, in which branch and series resistors 41 and 42 have the values 2R and R, respectively. The output $s_4$ is connected to the output terminal S of the converter. The fuses 5 connecting the inputs $a_3$ and $a_4$ to the ladders 51 and 52 are conductor portions of very restricted width (on the order of one micron) deposited upon the converter substrate in the same fashion as the portions of normal width representing the connecting conductors. By passing a current of sufficiently high intensity through the network of conductors, the fuses are made to melt without damaging the remainder of the circuit. The path followed by this high-intensity current can be so arranged that it melts only a single fuse, namely that whose elimination is required in order to adjust the converter.

The terminal $a_4$ is connected by its fuse 5 to the input 431 of an impedance adapter 40 whose output goes to the input $b_2$ of the ladder 51 whose two sections form junctions $t_1$, $t_2$. In the same fashion, the terminals $a_4$ and $a_3$ are connected by fuses 5 to the inputs 432 and 331 of adapters 40 respectively feeding the input $c_1$ of the ladder 52 and the input $b_1$ of the ladder 51. In addition, resistors 43, having resistance values very much in excess of R, ground the inputs of the adapters 40. The junctions $t_2$ and $u_1$ of the ladders 51 and 52 are connected by respective resistors 42 to a terminal $n_4$ which in turn is connected via a resistor 44, of resistance value 3R, to the terminal S. Point $n_4$ is a tap on a voltage divider constituted by resistor 44 and an adjoining resistor 42′, of magnitude R, interposed between terminals $S$ and $u_1$.

The fuses are utilized to correct the errors detected after manufacture of the converter, at the time of testing its accuracy. To this end, the digits $A_1$ and $A_2$ are given a predetermined value and the output voltages are compared with the nominal voltages for various combinations of the digits $A_3$ and $A_4$ (except for the combination 0,0 which by hypothesis should yield a negligible error).

For $A_3 = 1$ and $A_4 = 0$, the fuse connected to input 331 is melted if necessary; for $A_3 = 0$ and $A_4 = 1$, the fuse connected to input 432 is melted if necessary; and for $A_3 = A_4 = 1$ the fuse connected to input 431 is melted if necessary.

In the general case, taking an n-bit converter in which s bits are intrinsically exact, the main ladder will have *n* steps.

It is well known that in this case it is necessary to provide $n - s$ auxiliary ladders and $[ (n-s) (n-s-1) ]/2$ fuses. The resistance of resistor 44 is equal to:

$$R\ (2^{n-s} - 1)$$

The general well-known theory leads to the error function:

$$E = V_S - V_T$$

where $V_S$ is given by equation (2) generalized as to n and where $V_T$ is the theoretical value. In the case of a converter comprising nothing but purely resistive ladders, as is the case with the system according to my invention, it can be shown that:

$$E = \frac{V_o}{2^n} \Sigma a_p B_p \quad ,$$

$B_p$ being a binary number which expresses the error measured when only bit $A_p$ is equal to 1. If, by way of a voltage unit, the lowest significant voltage for the converter is chosen, the number $B_p$ will be expressed as:

$$B_p = \Sigma 2^m f_{mp},$$

*m* representing a whole number ranging from 1 to *p*, and $f_{mp}$ being a binary digit of value zero or 1.

The range of possible errors due to inaccuracy of the constituent parts can be expressed by a matrix $f_{mp}$, each element of which corresponds to an output-voltage error $2^{m-n}\ V_o$ if the digit $A_p$ is equal to unity. The fuses connecting the digit inputs of order p to the point of order n in an auxiliary resistor ladder make it possible to correct this error.

It can also be shown that $f_{mp}$ is zero in the following cases:

$$m > n - s$$
$$m \leqslant s$$
$$p - m < s$$

The matrix $f_{mp}$ is thus a triangular matrix which comprises $[ (n-s) (n-s-1) ]/2$ elements, that is to say an equal number of fuses and auxiliary-ladder steps.

The fuses can be melted by using a probe-type integrated-circuit test equipment, including a data processor. This conventional equipment is programmed to supply the test probes applied to the ends of the fuses with pulses which are in accordance with the measurement of the errors vitiating resistors accessible to other probes belonging to the equipment.

The invention is applicable to the digital control of machine tools, and in particular to machines designed to produce printed-circuit or integrated-circuit masks in which the tracing of the masks has to be carried out at very high speed.

What I claim is:

1. A digital-to-analog converter comprising:

a first plurality of terminals including *n* digital input terminals of different binary rank, an analog output terminal and a ground terminal, *n* being an integer greater than 1;

a first resistive ladder network with n first sections connected between said output and ground terminals, said sections including first series resistors of magnitude R and first branch resistors of magnitude 2R forming n first junctions;

a second resistive ladder network with *j* second sections connected between said output and ground terminals in parallel with said first ladder network, *j* being an integer smaller than *n*, said second sections including second series resistors of magnitude R and second branch resistors of magnitude 2R forming *j* second junctions;

a resistive connection of magnitude greater than R between said output terminal and said second ladder network;

*n* first impedance-adapting means with substantially zero output impedance connecting each of said input terminals with a respective first junction, the separation of said first junctions from said output terminal decreasing with increasing ranks of the input terminals connected thereto;

*j* second impedance-adapting means with substantially zero output impedance connecting the *j* highest-ranking input terminals with a respective second junction; and rupturable connector means between said *j* highest-ranking input terminals and said second impedance-adapting means enabling calibration of said first ladder network by selective disconnection of any of said second impedance-adapting means from the corresponding input terminals with resulting modification of the output voltage of said first ladder network due to energization of said corresponding input terminals.

2. A converter as defined in claim 1, further comprising a resistive third network with a third section connected between said output and ground terminals in parallel with said first and second ladder networks, said third section including a series resistor of magnitude R and a branch resistor of magnitude 2R forming a third junction, a resistive connection of magnitude greater than R between said output terminal and said third network, a third impedance-adapting means with substantially zero output impedance connecting the highest-ranking input terminal with said third junction, and further rupturable connector means between said highest-ranking input terminal and said third impedance-adapting means.

3. A converter as defined in claim 2 wherein the resistive connection between said output terminal and said third network comprises a voltage divider having a tap connected to said second network.

4. A converter as defined in claim 3 wherein said voltage divider includes a resistor of magnitude 3R separating said output terminal from said second network and a resistor of magnitude R separating said second network from said third network.

5. A converter as defined in claim 1 wherein each of said impedance-adapting means comprises an inverting amplifier with resistive feedback and with an output circuit including a Zener diode.

6. A converter as defined in claim 1 wherein said second impedance-adapting means are connected to said j highest-ranking input terminals in cascade with the corresponding first impedance-adapting means.

7. A converter as defined in claim 1 wherein said first and second impedance-adapting means are connected to said first and second junctions through said first and second branch resistors, respectively, each of said ladder networks further including a final series resistor of magnitude 2R connected between the last junction thereof and said ground terminal, the junction of said first ladder network farthest from said last junction being directly connected to said output terminal.

8. A converter as defined in claim 1 wherein said rupturable connector means are fusible conductors.

9. A converter as defined in claim 8 wherein said ladder networks, said impedance adapting means and said fusible conductors are formed in a monolithic integrated circuit, said fusible conductors being constituted by conductor portions of very restricted width in relation to the width of other intercomponent connections.

10. A converter as defined in claim 9 wherein the resistors constituting said networks are zones of ion implantation disposed in rectangular surface portions of a substrate, the ratio of two adjacent sides of said surface portions ranging between ½ and 2, the whole surface of said substrate having a resistance per square in excess of 1000 ohms.

* * * * *